United States Patent [19]

Hochschild

[11] Patent Number: 5,161,185
[45] Date of Patent: Nov. 3, 1992

[54] METHOD AND APPARATUS FOR REDUCING NOISE IN A DIGITAL VOLTAGE SIGNAL

[75] Inventor: James R. Hochschild, Plano, Tex.

[73] Assignee: Texas Instruments Incorporated, Dallas, Tex.

[21] Appl. No.: 850,243

[22] Filed: Mar. 11, 1992

Related U.S. Application Data

[63] Continuation of Ser. No. 752,173, Aug. 23, 1991, abandoned, which is a continuation of Ser. No. 369,156, Jun. 21, 1989, abandoned.

[51] Int. Cl.$^5$ .............................................. H04B 1/10
[52] U.S. Cl. .................................. 379/416; 375/99; 375/104; 328/115; 455/222
[58] Field of Search ........................... 375/98, 99, 104; 328/115, 150; 455/222, 223; 381/94; 379/416

[56] References Cited

U.S. PATENT DOCUMENTS

| | | | |
|---|---|---|---|
| 3,613,012 | 10/1971 | Feistel | 375/104 |
| 3,671,867 | 6/1972 | Schwarz | 375/104 |
| 3,958,133 | 5/1976 | Albano et al. | 375/104 |
| 4,416,017 | 11/1983 | Jasper et al. | 375/99 |
| 4,513,249 | 4/1985 | Baghdady | 328/150 |
| 4,528,678 | 7/1985 | Udren | 375/104 |
| 4,552,996 | 11/1985 | de Bergh | 375/99 |
| 4,587,620 | 5/1986 | Niimi et al. | 364/574 |
| 4,630,290 | 12/1986 | Kage | 375/104 |
| 4,689,805 | 8/1987 | Pyhälammi et al. | 375/11 |
| 4,797,624 | 1/1989 | Dunstan et al. | 328/114 |
| 4,870,603 | 9/1989 | Padawer | 364/574 |

*Primary Examiner*—James L. Dwyer
*Assistant Examiner*—M. Shehata
*Attorney, Agent, or Firm*—Troy J. Cole; Richard A. Stoltz; Jay Cantor

[57] ABSTRACT

A method and circuitry for reducing noise is provided. The circuit receives a digital data signal at its input (26). The signal is input to a magnitude evaluator (28) and a pass/squelch circuit (30). Magnitude evaluator (28) samples the digital signal and controls an integrator (36) according to the magnitude of each of the samples. Integrator (36) averages the magnitudes over time. If the signal is a noise signal, integrator (36) toggles a switch (40) to activate pass/squelch circuit (30) to squelch the digital data at its input (29). If the signal is a valid signal, then integrator (36) toggles switch (40) to deactivate pass/squelch circuit (30) to allow the digital data to pass therethrough to destination device (44).

59 Claims, 4 Drawing Sheets

METHOD AND APPARATUS FOR REDUCING NOISE IN A DIGITAL VOLTAGE SIGNAL

This application is a continuation of application Ser. No. 07/752,173, which is a continuation of 07/369,156, filed Aug. 23, 1991 and June 21, 1989 respectively, both now abandoned.

TECHNICAL FIELD OF THE INVENTION

This invention relates to digital signal processing, and more particularly to a method and apparatus for reducing noise within the output signal of an analog-to-digital converter.

BACKGROUND OF THE INVENTION

Idle channel noise is a factor and consideration which often must be addressed in designing circuit configurations subject to required specifications. The use of an analog-to-digital (A/D) converter in a circuit containing idle channel noise will effectively convert the channel noise to a digital signal. If the signal passes through multiple A/D and D/A converters, then the noise may accumulate to an undesirable level.

In commercial telephone systems, the range of pertinent signal levels typically extends down to approximately −50 dBm. However, the idle channel noise within the system typically measures −80 dBm under c-message weighting. Under current telephone systems, the idle channel noise is permitted to remain in the signal. Accordingly, at idle time periods, the A/D converter will still output signals from −50 to −80 dBm representing noise.

The idle noise signal may violate a specification standard or requirement. Cumulative effects associated with the noise signal may also occur, thereby creating troublesome static on the line. Further, when the line is monitored by delicate digital equipment, the noise signal may have a deleterious effect thereon. Therefore, it is clear that the idle noise signal is undersirable. As a result, there exists a need for a method and apparatus for reducing noise having magnitudes less than −50 to −60 dBm.

SUMMARY OF THE INVENTION

In accordance with the present invention, a method and apparatus are provided which substantially eliminate or reduce the disadvantages and problems associated with idle channel noise digitized by an A/D converter.

The method and apparatus provided herein reduce noise in a digital voltage signal directed from an A/D converter to a destination device. The present invention includes circuitry for evaluating the magnitude of the digital voltage signal at specified time intervals and then integrating each of the evaluated magnitudes over a predetermined time period to generate an average value. If the average value falls within a first predetermined range of magnitude, then a null voltage signal is substituted for the digital voltage signal and is directed toward the destination device. If the average value resulting from the integration is not within the first predetermined range of magnitude, then no substitution occurs and the digital voltage signal is permitted to pass to the destination device. The first predetermined range of magnitude under which a null voltage will be substituted is typically for signals under approximately −60 dBm. Either positive and/or negative voltage signals may be eliminated within this range.

The present invention further includes circuitry to disable the integration process if the value of one of the evaluated magnitudes exceeds the value of a predetermined threshold. When the integration step is eliminated, there is no passage of the predetermined time period associated therewith. Instead, the digital voltage signal will pass to the destination device without the possibility of a substituted null voltage signal. The integration step is synchronous with the evaluating step and may be an integer multiple the period of the evaluating step. Either the substituting step or the passing step is synchronous with the integration step. The integration step occurs at a sufficient delay time following the evaluating step so that the evaluation circuit may settle with a valid output.

The evaluating step may be effected by analyzing a group of the most significant bits of the A/D converter. More particularly, for an A/D converter having seven bits indicative of the amplitude of the signal, the six most significant bits may be analyzed in order to determine whether a noise signal is present. The integrating step may be effected by incrementing a counter when an evaluated magnitude is within the first predetermined range of magnitude and decrementing the counter when an evaluated magnitude is not within the first predetermined range of magnitude. The counter will therefore count up and down over time, varying with the magnitude of the digital signal. Consequently, the counter output at any given time will represent an average value indicative of the previously analyzed evaluated magnitudes. When the counter is within a first count range, the average value will be within the first predetermined range of magnitude and therefore, a null voltage will be substituted. Conversely, if the counter is within a second count range, the average value is not within the first predetermined range of magnitude, and the digital voltage signal will be permitted to pass to the destination device.

The present invention includes the technical advantage of reducing idle channel noise existing in a digitized signal output of an A/D converter. Another technical advantage of the present invention includes an override feature whereby any voltage signal beyond a predetermined threshold will not be affected by the noise reducing feature of the present invention.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1-7 of the drawings, like numerals being used for like and corresponding parts of the various drawings.

Figure 1:
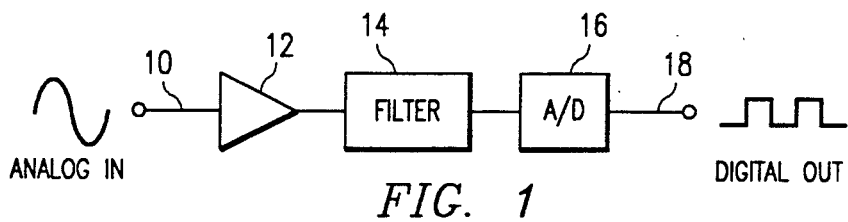
FIG. 1 illustrates a typical prior art communications channel.

FIG. 1 illustrates a common communications channel wherein an analog signal is converted to a digital signal. This configuration is used in applications such as telephone communications and the like. Illustrated is an input 10 connected to an amplifier 12. The output of amplifier 12 is connected to a filter 14. Filter 14 is utilized to select the particular bandwidth of data which should pass therethrough. The filtered analog signal is next connected to an analog-to-digital (A/D) converter 16. Therefore, output 18 represents a digital output signal corresponding to the analog signal at input 10.

The various components within FIG. 1 each contribute a certain quantity of noise to the data signal passing therethrough. The noise may exist by itself when the communication channel of FIG. 1 is idle, that is, has no valid data at its input. Specification requirements often dictate reduction or elimination of this "idle channel noise." Accordingly, the present invention receives the digital signal output by A/D converter 16 and acts to reduce or substantially eliminate the noise therefrom.

Figure 2:
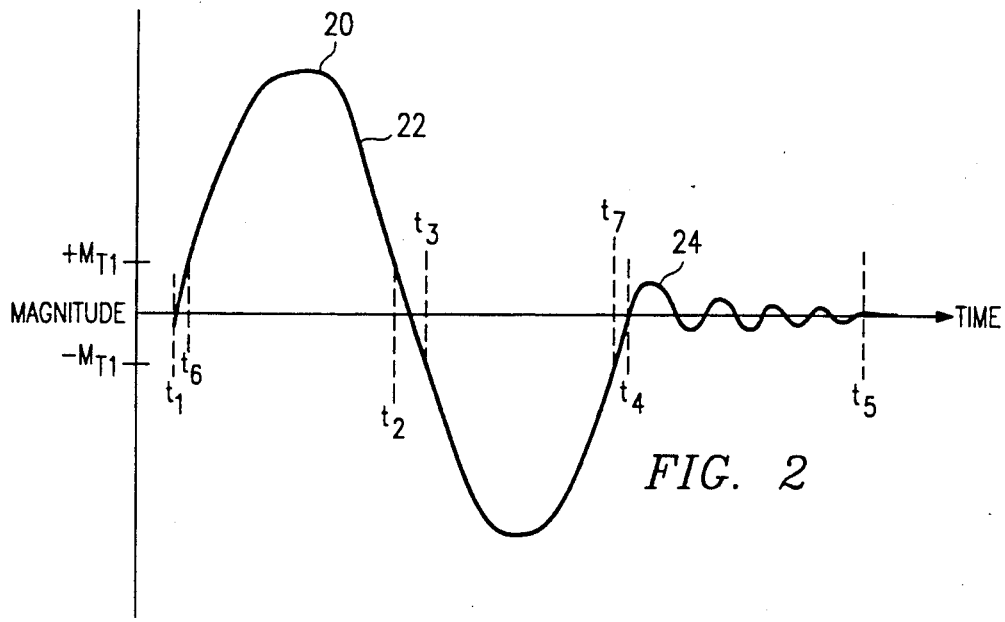
FIG. 2 illustrates a typical analog signal associated with the common communications channel of FIG. 1.

FIG. 2 illustrates a typical analog signal 20 which may be associated with the communications channel of FIG. 1. More particularly, analog signal 20, after amplification and filtering, may be input to A/D converter 16. A digital representation of analog signal 20 will then be output from A/D converter 16. Analog signal 20 is shown on a graph having a vertical axis denoting signal magnitude and a horizontal axis corresponding to time. The magnitude of analog signal 20 may be expressed in various different units. For purposes of this invention, the primary unit referenced herein will be the decibel milliwatt ("dBm"). This unit will be defined to be the RMS voltage necessary to dissipate one milliwatt within 600 ohms of resistance. It is to be understood that the dBm is solely illustrative and that the signal magnitudes and thresholds discussed herein may be established in terms of other units.

For purposes of illustration, analog signal 20 is shown to commence at a time $t_1$ and completely decay at a time $t_5$. Analog signal 20 comprises a valid signal 22 occurring from time $t_1$ to time $t_4$. An invalid or noise signal 24 is shown to occur from time $t_4$ to time $t_5$. The validity of a signal may be determined by analyzing the signal magnitude over a predetermined time period. A first threshold $+M_{T1}$ defines the limit below which the absolute value of analog signal 20 is not valid. For purposes of signals which are both positive and negative, a similar negative threshold denoted $-M_{T1}$ may be established. Thus, any signal which over time remains within the predetermined range of magnitude between $-M_{T1}$ and $+M_{T1}$ is presumed to be invalid. This range will be referred to herein as the small signal range.

Notably, not all signals within the small signal range are necessarily invalid. For example, where valid signal 22 passes in time between times $t_2$ and times $t_3$, the signal is valid but is passing from a positive to negative state. Alternatively, the invalid noise signal 24 remains within this predetermined range of magnitudes for a longer amount of time, that is, from $t_4$ to time $t_5$. Therefore, valid signal 22 may be distinguished from noise signal 24 by evaluating the signal magnitude over a sufficiently long predetermined time period. This predetermined time period must be sufficiently longer than that which would correspond to the time a valid signal passes within the predetermined range of magnitude corresponding to noise signals (i.e., $-M_{T1}$ to $+M_{T1}$). For example, the predetermined time period should be chosen to exceed time $t_3 - t_2$ in order to distinguish valid signal 22 from noise signal 24. It is an object of the present invention to provide a method and apparatus capable of distinguishing the transition of valid signal 22 occurring during time $t_2$ to time $t_3$ from invalid noise signal 24 occurring during time $t_4$ to time $t_5$.

Figure 3:
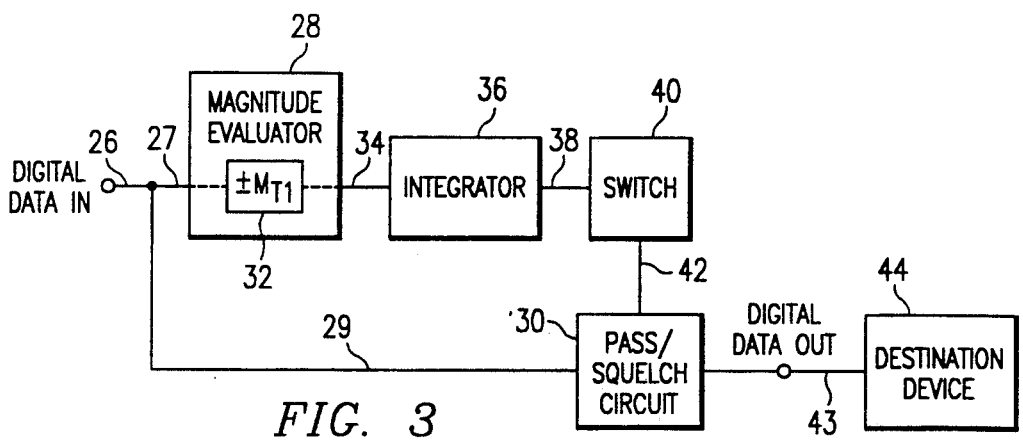
FIG. 3 illustrates a block diagram of the present invention.

FIG. 3 illustrates a block diagram of the present invention. A digital data input 26 is connected to the input 27 of a magnitude evaluator 28, and also to the data input 29 of a pass/squelch circuit 30. Magnitude evaluator 28 includes a first threshold detector 32 connected to input 27. The output of first threshold detector 32 is connected to the control input 34 of an integrator 36. The output of integrator 36 is connected to the input 38 of a switch 40. The output of switch 40 is connected to the control input 42 for pass/squelch circuit 30. Pass/squelch circuit 30 outputs a digital signal to the input 43 of a destination device 44.

In general, the block diagram of FIG. 3 operates to reduce noise from the digital signal input thereto. Magnitude evaluator 28 periodically determines the strength of the signal which will indicate whether or not the signal is valid. This determination is used to control integrator 36 which averages these determinations over time. If the signal is valid, then switch 40 is toggled off which causes pass/squelch circuit 30 to allow the digital data to pass therethrough. Conversely, if the signal is a noise signal, then switch 40 is toggled on which causes pass/squelch circuit 30 to squelch (i.e., eliminate) the noise from the signal. Squelching may be effected by having pass/squelch circuit 30 supply a null digital signal (i.e., no noise) to destination device 44.

The detailed operation of the block diagram of FIG. 3 is as follows. A digital data signal is generated by an A/D converter such as that shown in FIG. 1. This signal is a digital conversion of an analog signal such as that shown in FIG. 2. The digital signal is directed to a receiving or destination device 44 which may be any type of digital signal processing device. The present invention is connected in line to reduce noise from the signal prior to its reaching the destination device. Magnitude evaluator 28 periodically samples the magnitude of the digital signal at its input 27. More particularly, first threshold detector 32 determines whether or not the sampled signal is within the first predetermined range of magnitude defined to be between negative and positive $M_{T1}$. As a result of this determination, first threshold detector 32 controls integrator 36 to average either upward or downward according to whether or not the evaluated sample is within the small signal range. For illustrative purposes, the operation of the block diagram of FIG. 3 will be described in reference to analog signal 20 of FIG. 2. However, it is to be understood that the system is processing the digital representation of analog signal 20. In sampling analog signal 20 of FIG. 2 beginning at time $t_1$, first threshold detector 32 initially determines that analog signal 20 is within the first predetermined range of magnitude between negative and positive $M_{T1}$ (i.e., the small signal range). Accordingly, integrator 36 receives control signals from first threshold detector 32 reflecting that the analyzed signal is indeed within the first predetermined range of magnitude. Magnitude evaluator 28 continues to sample the signal and indicates within which predetermined range or threshold each analyzed sample exists. Integrator 36 acts to average this information in order to control switch 40 and pass/squelch circuit 30.

Integrator 36 collects control signals from magnitude evaluator 28 over a predetermined time period to generate an average therefrom. By averaging these control signals over a predetermined time period, integrator 36 may determine whether the signal is valid or is noise. When integrator 36 receives confirmation over the duration of the predetermined time period that each sample is within the first predetermined range of magnitude defined by $M_{T1}$, then integrator 36 will determine that the signal being analyzed is a noise signal and is undesirable. Accordingly, integrator 36 toggles switch 40 which activates pass/squelch circuit 30 to squelch the digital data signal. In other words, when the circuit determines that a noise signal is present, then the signal is squelched. Conversely, where magnitude evaluator 28 indicates through samples occurring beyond the predetermined time period that the signal is not within the predetermined range defined by $M_{T1}$, then integrator 36 acts to toggle switch 40 such that pass/squelch circuit 30 does not disturb the digital data, but allows it to pass therethrough.

The complete analysis of analog signal 20 in accordance with the present invention is as follows. At time $t_1$, magnitude evaluator 28 will begin to sample and determine the magnitude of analog signal 20 at a predetermined sampling rate. Initially, first threshold detector 32 will determine that analog signal 20 is within the small signal range of magnitude defined by $M_{T1}$. Accordingly, integrator 36 will begin to average this information. However, switch 40 is undisturbed until interator 36 may make a determination over the predetermined time period of integration. However, time $t_6$ occurs before the predetermined time period has passed. At time $t_6$, first threshold detector 32 will indicate that analog signal 20 is not within the small signal range and integrator 36 will reverse its averaging process to reflect a large signal. From time $t_6$ to time $t_2$, integrator 36 will receive continuous confirmation from first threshold detector 32 that the signal is a large signal because the samples are not within the small signal range defined by $M_{T1}$. Once integrator 36 has received this confirmation over its predetermined time period, then it may conclude that a large or valid signal is being processed. Accordingly, integrator 36 will toggle switch 40 such that pass/squelch circuit 30 allows the digital data to pass therethrough and connect to destination device 44.

As the sampling continues, time $t_2$ will pass and first threshold detector 32 will begin to indicate to integrator 36 that a signal within the small signal range is being processed. Accordingly, integrator 36 will begin to average these confirmations that a small signal is being processed. However, integrator 36 will integrate over the selected predetermined time period which is longer than the short time periods in which a valid signal may pass within the small signal range. Therefore, before integrator 36 is able to reach an average denoting a small signal, time $t_3$ will pass and first threshold detector 32 will again indicate a large signal is being processed. Therefore, the delay associated with the predetermined time period of integrator 36 prevents the circuit from squelching the information from time $t_2$ to time $t_3$, notwithstanding the determination that the magnitude during that time period is within the small signal range. Signal processing from time $t_3$ to time $t_7$ will again be similar to that from time $t_1$ to $t_2$.

At time $t_7$, first threshold detector 32 will again begin to confirm that a small signal is being processed. Integrator 36 will accumulate these confirmations. However, unlike the processing of valid signal 22, integrator 36 will receive continuous confirmation of a small signal beyond the predetermined time period associated with integrator 36. Thus, once the predetermined time period has passed with continuous confirmations of a small signal, integrator 36 will toggle switch 40 thereby activating pass/squelch circuit 30. Pass/squelch circuit 30 will squelch digital data at input 29 and, instead, provide a null voltage signal, that is, a digital data output having no noise therein. To accomplish a no noise signal, pass/squelch circuit 30 may generate a null voltage signal over the range where noise would be expected. For example, the null signal can be substituted over the digital bits corresponding to $-60$ dBm and below. It should be noted, however, that pass/squelch circuit 30 may generate a null signal over a larger range of magnitude.

Figure 4:
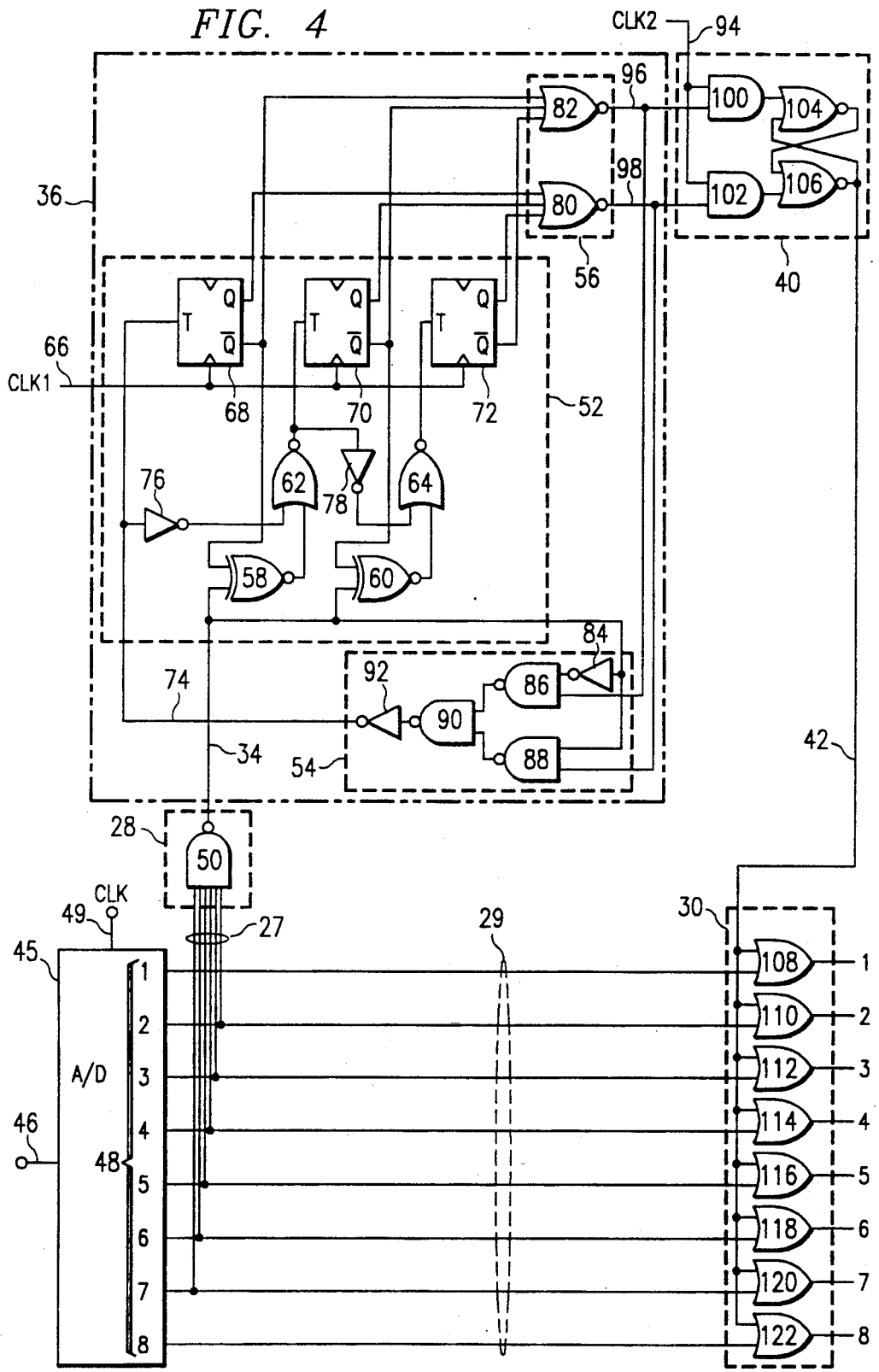
FIG. 4 illustrates a schematic embodiment utilized to implement the present invention.

FIG. 4 illustrates a schematic embodiment utilized to implement the present invention. The individual blocks of FIG. 3 are shown in phantom in FIG. 4 with each block encompassing the preferred components to carry forth the function of the block as described in connection with FIG. 3.

The digital data signal is provided by an A/D converter 45 which receives an analog signal at its input 46. A/D converter 45 provides a digital signal along an 8-bit output 48 in accordance with a sampling rate set by the CLK signal connected to clock input 49. Bit 8 of output 48 represents the sign bit of the signal being analyzed while bits 1-7 represent the magnitude thereof. Output 48 is connected generally to input 27 of magnitude evaluator 28 and input 29 of pass/squelch circuit 30. Magnitude evaluator 28 includes a NAND gate 50 having six inputs connected to bits 2-7 of output 48. The output of NAND gate 50 is connected generally to control input 34 of integrator 36.

Integrator 36 comprises three block components to effect the integration function set forth above. These three components include a counting circuit 52, an antiwraparound circuit 54, and a range detect circuit 56.

Counting circuit 52 includes a first and second XNOR gate 58 and 60, respectively, both having a first input connected to input 34 of integrator 36. The output of first XNOR gate 58 is connected to a first input of NOR gate 62. Similarly, the output of second XNOR gate 60 is connected to a first input of a second NOR gate 64. A clock input 66 is connected to the clock inputs of first, second and third toggle flip-flops ("T flip-flop") 68, 70, and 72, respectively. A clock signal CLK1 is used to control the frequency of operation for integrator 36. CLK1 signal is synchronous with the CLK signal, and occurs at a time thereafter in order to allow the output of NAND gate 50 to settle. A maintain input 74 is connected to the input of an inverter 76 and the toggle input of first T flip-flop 68. The output of inverter 76 is connected to a second input of first NOR gate 62. The output of first NOR gate 62 is connected to the input of an inverter 78 and the toggle input of second T flip-flop 70. The output of inverter 78 is connected to a second input of second NOR gate 64. The output of second NOR gate 64 is connected to the toggle input of third T flip-flop 72. The inverted output of first T flip-flop 68 is connected to a second input of first XNOR gate 58. The inverted output of second T flip-flop 70 is connected to a second input of second XNOR gate 64.

Both the output and inverted outputs of first, second and third T flip-flops 68, 70, and 72, are connected to range detect circuit 56. More particularly, the outputs of first, second and third T flip-flops 68, 70 and 72 are connected to inputs of a first NOR gate 80 within range detect circuit 56. Similarly, the inverted outputs of T flip-flops 68, 70 and 72 are connected to the inputs of a second NOR gate 82 within range detect circuit 56. The outputs of range detect circuit 56 are connected to both switch 40 and anti-wraparound circuit 54.

Anti-wraparound circuit 54 includes a first inverter 84 having its input connected to control input 34 of integrator 36 and its output connected to a first input of a first NAND gate 86. A second input to NAND gate 86 is connected to output 96 of second NOR gate 82 of range detect circuit 56. A second NAND gate 88 within anti-wraparound circuit 54 has a first input connected to control input 34 of integrator 36 and a second input connected to output 98 of first NOR gate 80 of range detect circuit 56. The outputs of first NAND gate 86 and second NAND gate 88 are both connected to the inputs of third NAND gate 90. The output of third NAND gate 90 is connected to a second inverter 92. The output of second inverter 92 is connected to the maintain input 74 of counting circuit 52.

Switch 40 comprises a clocked latching circuit having a clock input 94 and two signal inputs 96 and 98. A clock signal CLK2 is connected to clock input 94. CLK2 is synchronous with both the CLK signal and the CLK1 signal. Clock input 94 is further connected to a first input of a first AND gate 100 and a first input of a second AND gate 102. Signal input 96 is connected to a second input of AND gate 100. Similarly, signal input 98 is connected to a second input of second AND gate 102. The output of first AND gate 100 is connected to a first input of a first NOR gate 104. The output of second AND gate 102 is connected to a first input of a second NOR gate 106. The output of first NOR gate 104 is connected to a second input of second NOR gate 106. Similarly, the output of second NOR gate 106 is connected to a second input of first NOR gate 104. The output of second NOR gate 106 is also connected to control input 42 of pass/squelch circuit 30.

Pass/squelch circuit 30 includes eight OR gates 108, 110, 112, 114, 116, 118, 120 and 122. Each OR gate has a first input connected to control input 42. Bits 1-8 of A/D converter 45 are connected to a second input of each of OR gates 108-122, respectively. Thus, the output of OR gates 108-122 represents the digital signal corresponding to bits 1-8 of A/D converter 45. Each OR gate 108-122 of pass/squelch circuit 30 permits passing or squelching of a single bit of data passing therethrough. Where a small signal is detected, only the least significant bits of output 48 will indicate a signal thereon. As a result, there only exists a need to control these bits. Thus, the OR gates corresponding to the more significant bits may be eliminated while still permitting passing/squelching of small signals. For example, for signals under −60 dBm, only bits 1 and 2 need be controlled. Consequently, OR gates 112-122 would not be necessary to effect the inventive concept. Therefore, it is to be understood that only a select number of OR gates within pass/squelch circuit 30 may be necessary in the present invention, and this number is dependent upon the particular magnitude below which signals are squelched.

The operation of the circuitry within FIG. 4 is as follows. A/D converter 45 generates digital signal representations at a sampling rate determined by the CLK signal. In particular, an analog signal is connected to input 46 of A/D converter 45. For each CLK signal at clock input 49, A/D converter 45 generates a digital representation of the magnitude of the sample. This digital representation is placed along pins 1-8 with pin 8 representing whether the signal is positive or negative. Pin 1 is the least significant bit while pin 7 is the most significant bit of the sampled signal. A/D converter 45 typically operates in a active low fashion. Therefore, when a very small signal is sampled, bits 1-7 will all be high. As the signal increases, bit 1 will go low. As the signal further increases, bits 2-7 will also go low. Accordingly, for signals within a certain defined small signal, only bit 1 will toggle between a one and zero status, while bits 2-7 will all remain high. In particular, signals below approximately −60 dBm will only cause bit 1 to go low, and therefore, bits 2-7 will all remain high. Thus, bits 2-7 may be monitored such that if any bit within that group goes low, it may be concluded that the signal being sampled by A/D converter 45 is larger than −60 dBm and therefore, is not a small or invalid noise signal. Accordingly, bits 2-7 are connected to NAND gate 50. When a small signal is present, bits 2-7 will all be high and the output of NAND gate 50 will be low. However, when a signal that has a magnitude greater than −60 dBm is sampled, bits 2 and above will begin to go low, thereby causing the output of NAND gate 50 to go high. The change in the output of NAND gate 50 is used to control integrator 36. It is also to be noted that by ignoring Pin 8 (the sign bit), an absolute value determination is made. However, pin 8 could be incorporated into the present invention if it were desirable to analyze only either a positive or negative signal.

The output of NAND gate 50 directs the integration process which occurs at an integration frequency set by the CLK1 signal. More particularly, this output indicates that counting circuit 52 should increment for small signals and decrement for large signals. As a result, at an integration frequency set by the CLK1 signal, counting circuit 52 will count upward toward a large count when small signals are continuously sampled. Conversely, counting circuit 52 will count downward toward a small count when large signals are sampled. Therefore, the number of counts at any one time represents the average of the previously received signal samples. For example, when a small signal is sampled by A/D converter 45, bits 2-7 will all be high and the output of NAND gate 50 will be low. The low output will cause counting circuit 52 to increment. A/D converter 45 will continue to sample and NAND gate 50 will continue to evaluate bits 2-7. If the signal remains small, then after each sampling, counting circuit 52 will continue to increment.

Anti-wraparound circuit 54 monitors counting circuit 52 to prevent the wraparound thereof. Counting circuit 52 includes three bits and therefore may count between 0 and 7 (i.e., range of $2^3$). Anti-wraparound circuit 54 operates so that when counting circuit 52 reaches either zero counts or seven counts, wraparound is not permitted. In other words, the counter is permitted to count up until seven and will be maintained at seven thereafter so long as small signals are received. Once the counter reaches seven, range detect circuit 56 detects that the counter has reached an extreme. Thus, at the next CLK2 signal, switch 40 will latch on, thereby yielding a high output from switch 40. The high output from switch 40 will cause pass/squelch circuit 30 to squelch the noise signal. More particularly, outputs 1-8 of pass/squelch circuit 30 will all go high. As discussed above, a digital output of all high bits indicates a no noise null signal. Thus, it may be appreciated that where A/D converter 45 continuously samples a small signal, then counting circuit 52 is permitted to increment until it reaches a first extreme causing switch 40 to activate pass/squelch circuit 30. One pass/squelch circuit 30 is activated, then the input signal thereto is squelched by providing a null signal output.

In the opposite instance where the sampled signal is greater than a small signal, NAND gate 50 will continuously remain low thereby permitting counting circuit 52 to continuously decrement. Once counting circuit 52 reaches the second extreme of zero counts, then range detect circuit 56 causes switch 40 to latch low. The low output of switch 40 is input to the OR gates of pass/squelch circuit 30. Accordingly, each OR gate 108-122 will simply pass the data of pins 1-8 therethrough without squelching the information presented by each pin. Again, if large samples are further received, anti-wraparound circuit 54 will maintain counting circuit such that it cannot wraparound below a zero count.

Integrator 36 operates at an integration frequency determined by the CLK1 signal which is synchronous with and subsequent to the CLK signal. It should be noted that the period of the CLK1 signal may be an integer multiple N of the period of the CLK signal. This will have the effect of integrating every Nth sample of A/D converter 45. For example, if the period of the CLK1 signal is three times that of the CLK signal, then every third sample of A/D converter 45 will affect the counting of integrator 36. As a result, the period of the CLK1 signal may be adjusted to vary the predetermined time period of integration.

While the latching process of switch 40 has been described as occurring when counter 52 reaches either a first extreme of zero counts or a second extreme of second counts, it is to be understood that a first and second count range may alternatively be used. For example, the circuitry may be configured such that switch 40 toggles on when the counter indicates a count range of six to seven counts and toggles off when the counter indicates a count range of zero to one counts. By using a range rather than an extreme, the predetermined time period of integration is reduced. In the case of extremes, it will take at least seven cycles of the CLK1 signal before counting circuit 52 can increment from zero counts to seven counts. Consequently, there is a minimal amount of time equal to seven CLK1 cycles before integrator 36 can change from a small signal to a large signal indication, and vice versa for a large signal to small signal indication. However, if the ranges given above are used, then only five CLK1 cycles would be necessary for this transition. As a result, the predetermined time period of integration is effectively reduced by using count ranges rather than count extremes.

Figure 5:
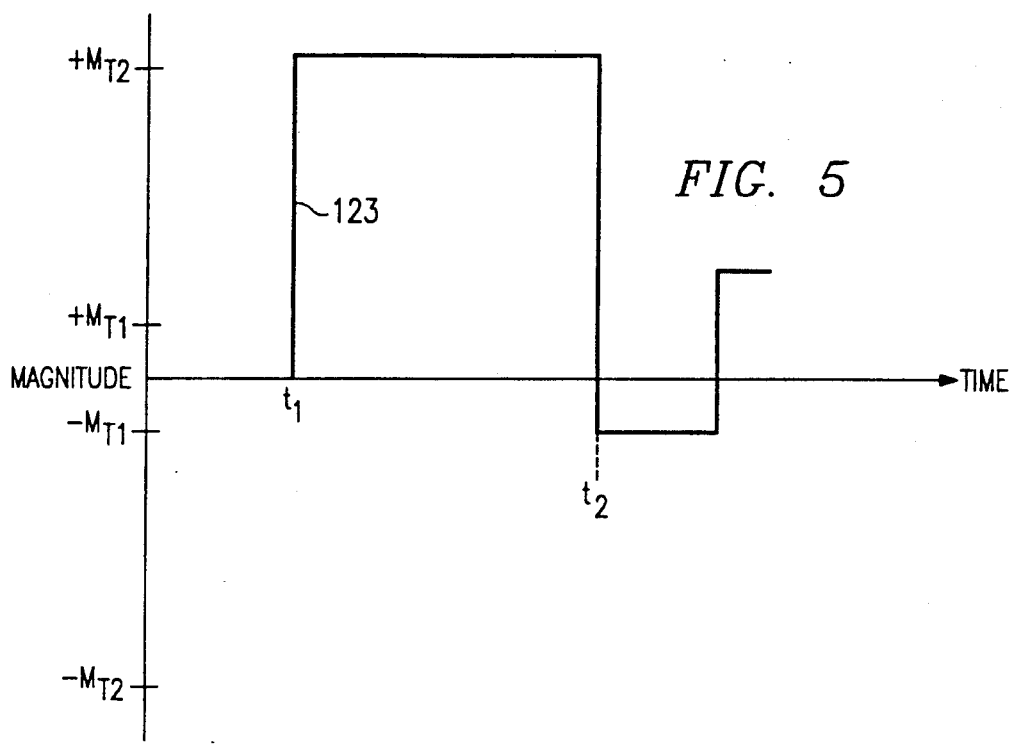
FIG. 5 illustrates a waveform giving rise to another feature of the present invention.

FIG. 5 illustrates a waveform 123 giving rise to another aspect of the present invention. Waveform 123 is depicted as a function of magnitude and time. In addition to the first range of magnitude from negative to positive $M_{T1}$, a predetermined threshold $M_{T2}$ is established. The magnitude of threshold $M_{T2}$ is selected high enough such that any signal exceeding the absolute value of $M_{T2}$ (i.e., more positive than $+M_{T2}$ or more negative than $-M_{T2}$) will necessarily be a large signal. Thus, when this threshold is exceeded, it is clear that a large signal is being processed and there is no need for a determination over time as to whether the signal is indeed valid. Accordingly, there is no need to integrate samples over time when the threshold is surpassed. Therefore, it is an additional object of the present invention to detect when the sampled signal exceeds threshold $M_{T2}$ and immediately allow passage of the signal through pass/squelch circuit 30 without the delay time of integration. In order to accomplish this result, integrator 36 may be temporarily disabled such that the predetermined time period of integration need not pass before pass/squelch circuit 30 will permit the sample to pass therethrough. For example, at time $t_1$, waveform 123 exceeds $M_{T2}$. Integrator 36 will be temporarily disabled such that pass/squelch circuit 30 will permit immediate passing of the waveform 123 at time $t_1$. As waveform 123 remains above $M_{T2}$, this passing process will continue and no integration will occur. However, at time $t_2$, waveform 123 will be within threshold $M_{T2}$ and therefore, integration will occur as described above.

Figure 6:
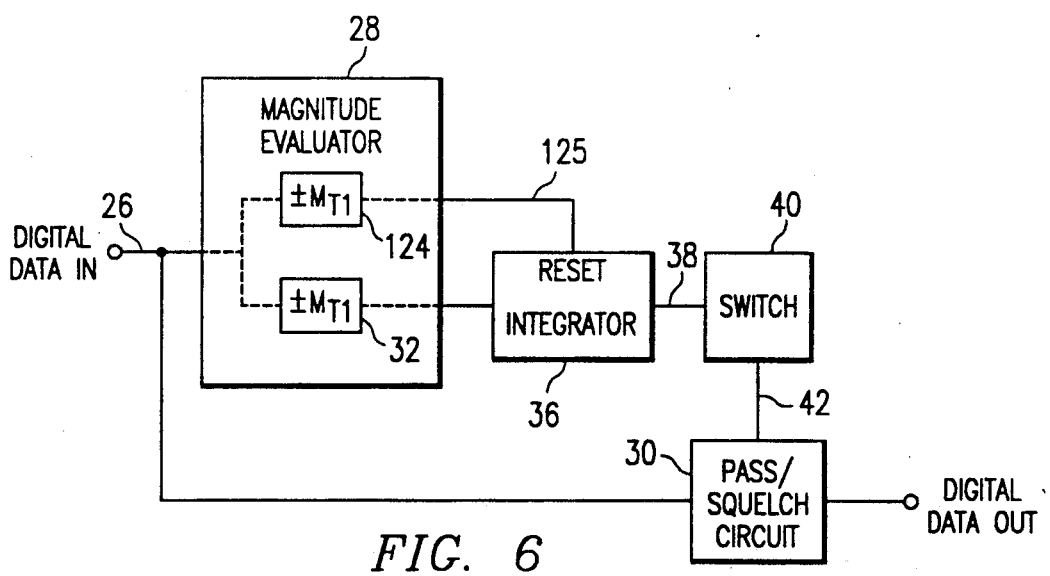
FIG. 6 illustrates the block diagram of FIG. 3 having additional features added thereto.

FIG. 6 illustrates the block diagram of FIG. 3 having an additional inventive feature added thereto in order to effect the principles discussed in connection with FIG. 5. The blocks shown within FIG. 5 are identical to those shown within FIG. 3 with the exception of an additional threshold detector 124 within magnitude evaluator 28 and having its output connected to the reset input 125 of integrator 36. Where digital data input to magnitude evaluator 28 represents a signal larger than the predetermined threshold $M_{T2}$, threshold detector 124 will reset integrator 36, thereby permitting passage of the signal through pass/squelch circuit 30 without the time period of integration. In the preferred embodiment, this reset feature is accomplished by placing integrator 36 in all zero status. As discussed above, once a zero occurs, switch 40 acts to control pass/squelch circuit 30 to allow the data to pass therethrough without any squelching effect. Thus, when a signal is evaluated which exceeds $M_{T2}$, the predetermined time period of integrator 36 does not occur, but rather pass/squelch circuit 30 immediately permits the signal to pass therethrough.

Figure 7:
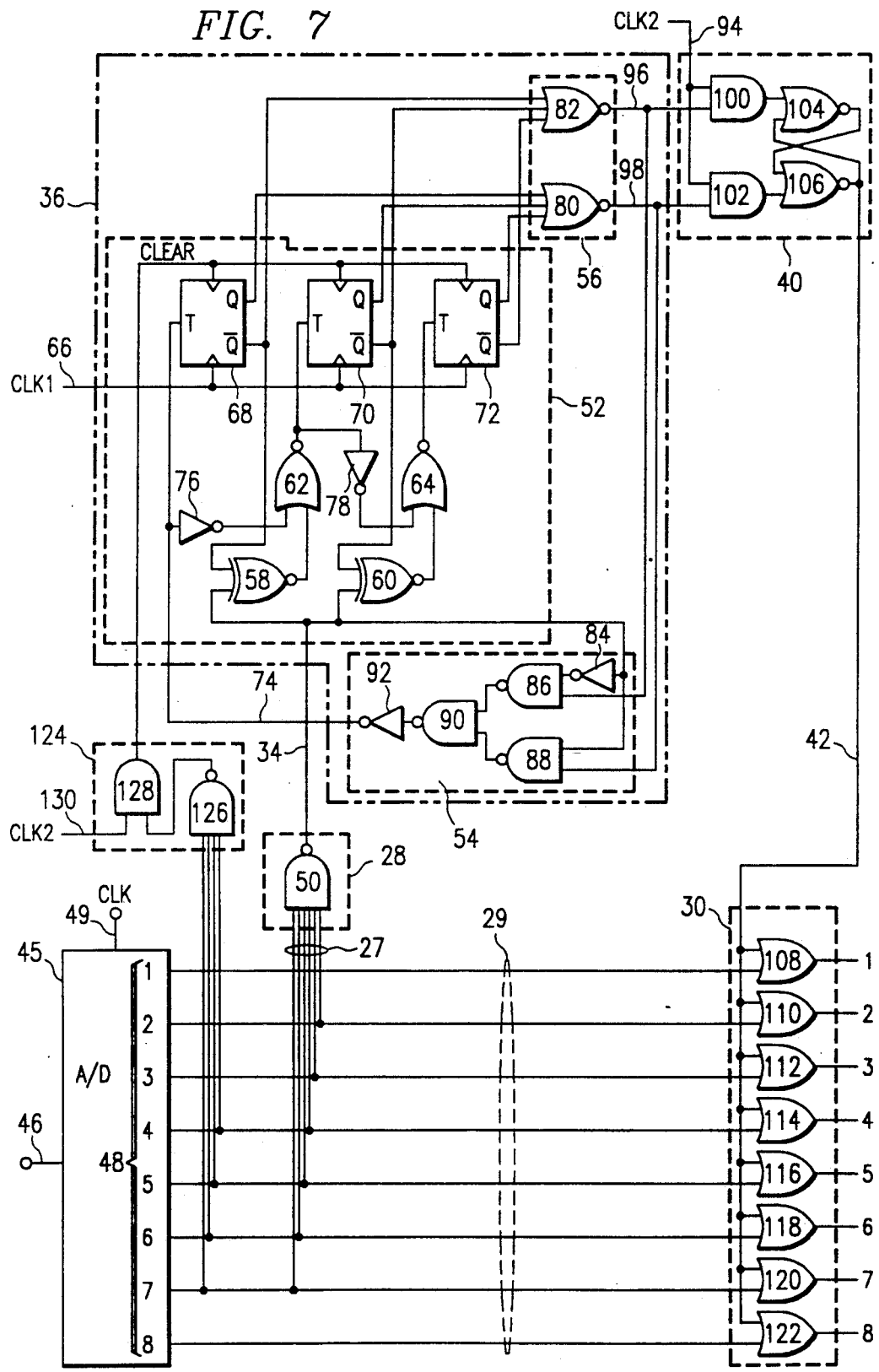
FIG. 7 illustrates the schematic embodiment of FIG. 4 with the addition of a second threshold detector to implement the features of FIGS. 5–6.

FIG. 7 illustrates the schematic drawing of FIG. 4 with the addition of threshold detector 124 added thereto. Pins 4, 5, 6 and 7 of A/D converter 45 are connected to the inputs of NAND gate 126. The output of NAND gate 126 is connected to a first input of AND gate 128. A second input of AND gate 128 is connected to a clock input 130 of threshold detector 124. Clock signal CLK2 is also connected to clock input 130. The output of AND gate 128 is connected to the reset input of T flip-flops 68, 70 and 72.

In operation, the components within threshold detector 124 act to reset T flip-flops 68, 70 and 72 in the instance where a signal which exceeds a predetermined threshold $M_{T2}$ is sampled by A/D converter 45. The particular value of $M_{T2}$ is established by selecting a group of most significant bits of the output of A/D converter 45. For example, in FIG. 6, bits 4-7 of A/D converter 45 are input to NAND gate 126 in order to establish a threshold of approximately 52 dBm. When a signal less than 52 dBm is sampled by A/D converter 45, then bits 4-7 will all remain high. Consequently, the output of NAND gate 126 will remain low and thus, have no effect on the reset inputs of T flip-flops 68, 70 and 72. However, when the sampled signal exceeds 52 dBm, bits 4 and possibly, bits 5-7 will go low thereby causing the output of NAND gate 126 to go high. Once threshold detector 124 is clocked by CLK2, this clock signal will combine with the high output of NAND gate 126 to cause the output of AND gate 128 to go high. A high output of AND gate 128 will reset or clear T flip-flops 68, 70 and 72. As discussed above, when these three flip-flops have a zero output, switch 40 toggles to disable pass/squelch circuit 30 such that any bits input thereto are passed therethrough. It is to be noted that the reset feature will also perform properly should count ranges (e.g., zero to one count and six to seven counts) be utilized rather than the extremes of zero or seven counts as discussed above.

Although the present invention has been described in detail, it should be understood that various changes, substitutions and alterations can be made herein without departing from the spirit and scope of the invention as defined by the appended claims.

What is claimed is:

1. A method of reducing noise in a digital voltage signal directed to a destination device, comprising:
   digitally evaluating the magnitude of the digital voltage signal to obtain an evaluated magnitude;
   digitally integrating the evaluated magnitude at an integration frequency and over a predetermined time period to generate an average value; and
   substituting a null voltage signal for the digital voltage signal to the destination device if the average value is within a first predetermined range of magnitude.

2. The method of claim 1 wherein the first predetermined range of magnitude is any magnitude range below approximately −6 0 dBm.

3. The method of claim 1 and further comprising outputting the digital voltage signal to the destination device if the average value is not within the first predetermined range of magnitude.

4. The method of claim 3 wherein the first predetermined range of magnitude is any magnitude range below approximately −60 dBm.

5. The method of claim 1 and further comprising:
   disabling said integrating step if the value of said evaluated magnitude exceeds the value of a predetermined threshold; and
   coupling the digital voltage signal to the destination device without the passage of said predetermined time period.

6. The method of claim 5 wherein the predetermined threshold is approximately −52 dBm.

7. The method of claim 1 wherein said integrating step is synchronous with said evaluating step.

8. The method of claim 3 wherein said substituting step is synchronous with said integrating step.

9. The method of claim 3 wherein said connecting step is synchronous with said integrating step.

10. The method of claim 3 wherein said integrating step occurs at a sufficient delay time following said evaluating step.

11. The method of claim 1 wherein the digital voltage signal comprises a plurality of bits and said evaluating step comprises evaluating a selected group of most significant bits of the digital voltage signal.

12. The method of claim 11 wherein said selected group of most significant bits comprises bits 2-7 of the digital voltage signal.

13. The method of claim 3 wherein said integrating step comprises:
   incrementing a counter when an evaluated magnitude is within the first predetermined range of magnitude; and
   decrementing the counter when an evaluated magnitude is not within the first predetermined range of magnitude.

14. The method of claim 13 wherein the average value is within the first predetermined range of magnitude if the counter is within a first count range.

15. The method of claim 14 wherein the first count range is from six to seven counts.

16. The method of claim 13 wherein the counter is a three bit counter, and the average value is within the first predetermined range of magnitude if the count equals seven.

17. The method of claim 13 wherein the average value is not within the first predetermined range of magnitude if the counter is within a second count range.

18. The method of claim 17 wherein the second count range is from zero to one counts.

19. The method of claim 13 wherein the counter is a three bit counter, and the average value is not within the first predetermined range of magnitude if the count equals zero.

20. A method of reducing noise in a telephone communications channel voltage signal, the voltage signal passing through an amplifier, filter and an A/D converter to obtain a digital voltage signal directed to a destination device, comprising:
   digitally evaluating the magnitude of the digital voltage signal to obtain an evaluated magnitude;
   digitally integrating the evaluated magnitude at an integration frequency and over a predetermined time period to generate an average value;
   coupling a null voltage signal to the destination device if the average value is within a first predetermined range of magnitude, the null voltage signal being generated over a second predetermined range of magnitude; and
   coupling the digital voltage signal to the destination device if the average value is not within the first predetermined range of magnitude.

21. The method of claim 20 wherein the first predetermined range of magnitude is any magnitude less than approximately −60 dBm.

22. The method of claim 20 and further comprising disabling said integrating step if the value of said evaluated magnitude exceeds the value of a predetermined threshold so that the digital voltage signal will reach the destination device without the passage of said predetermined time period.

23. The method of claim 22 wherein the predetermined threshold is approximately −52 dBm.

24. The method of claim 20 wherein said integrating step is synchronous with said evaluating step.

25. The method of claim 20 wherein the digital voltage signal is provided by an analog-to-digital converter, and said evaluating step comprises evaluating a selected group of most significant bits of the digital voltage signal.

26. The method of claim 25 wherein the selected group of most significant bits comprises bits 2-7 of the digital voltage signal.

27. The method of claim 20 wherein said integrating step comprises:
incrementing a counter when an evaluated magnitude is within the first predetermined range of magnitude; and
decrementing the counter when an evaluated magnitude is not within the first predetermined range of magnitude.

28. The method of claim 27 wherein the average value is within the first predetermined range of magnitude if the counter is within a first count range from six to seven counts.

29. The method of claim 27 wherein the counter is a three bit counter, and the average value is within the first predetermined range of magnitude if the count equals seven.

30. The method of claim 27 wherein the average value is not within the first predetermined range of magnitude if the counter is within a second count range from zero to one counts.

31. The method of claim 27 wherein the counter is a three bit counter, and the average value is not within the first predetermined range of magnitude if the count equals zero.

32. A method of forming circuitry for reducing noise in a digital voltage signal directed to a destination device, comprising:
forming a digital magnitude evaluator for evaluating the magnitude of a digital voltage signal;
forming a digital integrator for integrating the evaluated magnitude at an integration frequency and over a predetermined time period to generate an average value; and
forming a digital squelch circuit for substituting a null voltage signal for the digital voltage signal to the destination device if the average value is within a first predetermined range of magnitude, the null voltage signal being generated over a second predetermined range of magnitude.

33. The method of claim 32 wherein said step of forming a squelch circuit comprises forming the first predetermined range of magnitude is any magnitude less than approximately −60 dBm.

34. The method of claim 32 and further comprising forming a pass circuit for connecting the digital voltage signal to the destination device if the average value is not within the first predetermined range of magnitude.

35. The method of claim 34 wherein said step of forming a squelch circuit comprises forming the first predetermined range of magnitude is any magnitude less than approximately −60 dBm.

36. The method of claim 32 and further comprising disabling said integrating step if the value of said evaluated magnitude exceeds the value of a predetermined threshold so that the digital voltage signal will reach the destination device without the passage of said predetermined time period.

37. The method of claim 36 wherein wherein said forming a circuit comprises setting the predetermined threshold at approximately −52 dBm.

38. The method of claim 32 wherein the digital voltage signal is provided by an analog-to-digital converter, and said step of forming the evaluator comprises forming an evaluator for evaluating a selected group of most significant bits of the digital voltage signal.

39. The method of claim 38 wherein said step of forming the evaluator comprises forming an evaluator for evaluating bits 2-7 of the digital voltage signal.

40. The method of claim 32 wherein said step of forming the integrator comprises forming a counter for incrementing when an evaluated magnitude is within the first predetermined range of magnitude and for decrementing when an evaluated magnitude is not within the first predetermined range of magnitude.

41. The method of claim 40 wherein said step of forming the counter comprises forming a three bit counter.

42. A circuit for reducing noise in a digital voltage signal directed to a destination device, comprising:
circuitry for digital evaluating the magnitude of a digital voltage signal;
circuitry for digitally integrating the evaluated magnitude at an integration frequency and over a predetermined time period to generate an average value; and
circuitry for substituting a null voltage signal for the digital voltage signal to the destination device if the average value is within a first predetermined range of magnitude, the null voltage signal being generated over a second predetermined range of magnitude.

43. The circuit of claim 42 wherein the first predetermined range of magnitude is any magnitude less than approximately −60 dBm.

44. The circuit of claim 42 and further comprising circuitry for connecting the digital voltage signal to the destination device if the average value is not within the first predetermined range of magnitude.

45. The circuit of claim 44 wherein the first predetermined range of magnitude is any magnitude less than approximately −60 dBm.

46. The method of claim 42 and further comprising disabling said integrating step if the value of said evaluated magnitude exceeds the value of a predetermined threshold so that the digital voltage signal will reach the destination device without the passage of said predetermined time period.

47. The circuit of claim 46 wherein the predetermined threshold is approximately −52 dBm.

48. The circuit of claim 42 wherein said circuitry for integrating is for operating synchronous with said circuitry for evaluating.

49. The circuit of claim 44 wherein either said circuitry for substituting or said circuitry for connecting operates synchronous with said circuitry for integrating.

50. The circuit of claim 42 wherein said circuitry for integrating operates at a sufficient delay time following said circuitry for evaluating.

51. The circuit of claim 42 wherein the digital voltage signal is provided by an analog-to-digital converter, and said circuitry for evaluating comprises circuitry for evaluating a selected group of most significant bits of the digital voltage signal.

52. The circuit of claim 51 wherein the selected group of most significant bits comprises bits 2-7 of the digital voltage signal.

53. The circuit of claim 44 wherein said circuitry for integrating comprises a counter for incrementing when an evaluated magnitude is within the first predetermined range of magnitude and for decrementing when an evaluated magnitude is not within the first predetermined range of magnitude.

54. The circuit of claim 53 wherein the average value is within the first predetermined range of magnitude if the counter is within a first count range.

55. The circuit of claim 54 wherein the first count range is from six to seven counts.

56. The circuit of claim 53 wherein the counter is a three bit counter, and the average value is within the first predetermined range of magnitude if the count equals seven.

57. The circuit of claim 53 wherein the average value is not within the first predetermined range of magnitude if the counter is within a second count range.

58. The circuit of claim 57 wherein the second count range is from zero to one counts.

59. The circuit of claim 53 wherein the counter is a three bit counter, and the average value is not within the first predetermined range of magnitude if the count equals zero.

* * * * *